(12) United States Patent
Klem

(10) Patent No.: US 6,931,045 B1
(45) Date of Patent: Aug. 16, 2005

(54) DISTRIBUTED BRAGG REFLECTORS WITH REDUCED OPTICAL ABSORPTION

(75) Inventor: John F. Klem, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 226 days.

(21) Appl. No.: 10/609,294

(22) Filed: Jun. 26, 2003

Related U.S. Application Data

(63) Continuation-in-part of application No. 10/217,803, filed on Aug. 12, 2002, now abandoned.

(51) Int. Cl.[7] .............................................. H01S 5/00
(52) U.S. Cl. ......................................... 372/47; 372/96
(58) Field of Search ........................... 372/11, 19, 99, 372/101, 109, 96, 75, 43–50

(56) References Cited

U.S. PATENT DOCUMENTS

| | | | |
|---|---|---|---|
| 5,392,307 A * | 2/1995 | Sugiyama et al. ............. | 372/45 |
| 6,075,804 A * | 6/2000 | Deppe et al. .................. | 372/96 |
| 6,301,281 B1 | 10/2001 | Deng et al. .................... | 372/45 |
| 6,393,038 B1 | 5/2002 | Raymond et al. ............. | 372/22 |
| 6,487,230 B1 * | 11/2002 | Boucart et al. ................ | 372/96 |
| 6,653,158 B2 * | 11/2003 | Hall et al. ..................... | 438/22 |
| 6,714,573 B2 * | 3/2004 | Coldren et al. ................ | 372/47 |
| 6,721,348 B2 * | 4/2004 | Moser et al. .................. | 372/96 |
| 2002/0024989 A1 | 2/2002 | Coldren et al. ................ | 372/96 |
| 2002/0101894 A1 | 8/2002 | Coldren et al. ................ | 372/43 |
| 2002/0150135 A1 | 10/2002 | Naone et al. .................. | 372/45 |

OTHER PUBLICATIONS

Guilhem Alumuneau et al, *"Improved Electrical and Thermal Properties of InP-AlGaAsSb Bragg Mirrors for Long-Wavelength Vertical-Cavity Lasers"*, IEEE Photonics Technology Letters, vol. 12, No. 10 Oct. 2000 pps.1322-1324.

* cited by examiner

Primary Examiner—Minsun Oh Harvey
Assistant Examiner—Tuan N. Nguyen
(74) Attorney, Agent, or Firm—Brian W. Dodson; John P. Hohimer

(57) ABSTRACT

A new class of distributed Bragg reflectors has been developed. These distributed Bragg reflectors comprise interlayers positioned between sets of high-index and low-index quarter-wave plates. The presence of these interlayers is to reduce photon absorption resulting from spatially indirect photon-assisted electronic transitions between the high-index and low-index quarter wave plates. The distributed Bragg reflectors have applications for use in vertical-cavity surface-emitting lasers for use at 1.55 $\mu$m and at other wavelengths of interest.

23 Claims, 2 Drawing Sheets

DISTRIBUTED BRAGG REFLECTORS WITH REDUCED OPTICAL ABSORPTION

CROSS REFERENCE TO RELATED APPLICATIONS

This is a continuation-in-part of co-pending application Ser. No. 10/217,803 filed on Aug. 12, 2002.

GOVERNMENT RIGHTS

This invention was made with Government support under Contract DE-AC04-94AL85000 awarded by the U.S. Department of Energy. The Government has certain rights in the invention.

FIELD OF THE INVENTION

The present invention relates generally to optical devices, and in particular to such devices comprising distributed Bragg reflectors.

BACKGROUND OF THE INVENTION

Distributed Bragg reflectors, or DBRs, are in common use in both passive and active optical elements. A typical application is to form the optical cavity for a vertical cavity surface emitting laser, or VCSEL. A prior art VCSEL is shown in FIG. 1 in a schematic cross-sectional view. In this example, contact 100 makes electrical contact to an n-type DBR 110, and ring contact 101 makes electrical contact to a p-type DBR reflector 130. The region between the two DBRs is the optical cavity 120 of the VCSEL, which comprises a laser medium 123 located between optical spacers 121 and 122. Laser medium 123 typically comprises a semiconductor heterostructure, which can take the form of a set of quantum wells.

The n-type DBR 110 consists essentially of an alternating stack of high-refractive index layers 111 and low-refractive index layers 112. Layers 111 and 112 each typically have an optical thickness nominally equal to a quarter wavelength of the light which the VCSEL is intended to emit. Thus, layers 111 have a smaller physical thickness than do layers 112, as shown in FIG. 1. Similarly, the p-type DBR 130 consists essentially of an alternating stack of high-refractive index layers 131 and low-refractive index layers 132. Layers 131 and 132 also typically each have an optical length nominally equal to a quarter wavelength of the intended light to be emitted by the VCSEL.

In operation, a current source (not shown) is attached to contact 100 and ring contact 101, and an electrical current flows vertically through the stack of layers comprising the VCSEL, producing electrons and holes that recombine in the laser medium 123 to produce optical gain for lasing. The small size of the optical cavity 120 is beneficial in that it has a small volume and a small active length. The small volume serves to lower the lasing threshold current relative to that required in competing devices, and also allows faster switching of the laser output. The small cavity length makes it easier to excite only a single laser mode, a property beneficial for many optical communication applications.

The use of such a small optical cavity, however, forces adoption of stringent performance criteria for the distributed Bragg reflectors. The distributed Bragg reflectors must have very high reflectivity at the intended emission wavelength, owing to the small optical gain which can be derived from such a short optical cavity. For the same reason, the distributed Bragg reflectors must exhibit very low absorption of light at the intended emission wavelength. Finally, for purposes of electrical and thermal performance, the distributed Bragg reflectors must have acceptably large electrical and thermal conductivity.

The reflectivity of a distributed Bragg reflector increases both with the number of layers in the reflector, and with the difference in the indices of refraction in the alternating layers. However, large difference in the indices of refraction generally correlates with a large difference in the electronic bandgap, which yields a DBR with smaller electrical conductivity. The design and performance of the distributed Bragg reflectors is generally a limiting factor in the functionality of an intended VCSEL device.

VCSELs which emit in the 1.55 $\mu$m (micrometer) spectral range are of particular interest for optical communication applications. Optical fibers exhibit particularly low signal loss in this spectral range. Unfortunately, VCSELs designed for this spectral range have until recently required the fusion of separately grown structures to avoid problems with excess lattice stress.

There are, however, material systems in which a monolithic VCSEL structure can be designed and implemented for the 1.55 $\mu$m spectral region without unmanageable mismatch stress. One of the best studied at this point comprises the use of the InP-AlGaAsSb system to form the distributed Bragg reflectors, and in which the laser medium comprises AlGaInAs or InGaAsP quantum wells or equivalent structures.

In the InP-AlGaAsSb system, the AlGaAsSb alloy can be chosen to have a composition near $Al_{0.1}Ga_{0.9}As_{0.52}Sb_{0.48}$, a composition which substantially lattice matches with InP. The InP has a refractive index of about 3.18, while the AlGaAsSb alloy has a refractive index of about 3.61, meaning that the index contrast between the two materials is about 13%. A distributed Bragg reflector containing 20 pairs of layers of these materials has an optical reflectivity of about 0.994, a value quite suitable for use in VCSELs. These materials also exhibit good electronic and thermal properties for application in VCSELs.

Unfortunately, this material system has the disadvantage of exhibiting significant optical absorptivity in the spectral range of interest. This is the result of spatially indirect photon-assisted electronic transitions from the valence band of the AlGaAsSb alloy to the conduction band of the InP material.

The electronic bandstructure of an abrupt interface 230 between an InP layer 210 and an AlGaAsSb layer 220 is shown schematically in FIG. 2. Here vertical displacement corresponds to energy differences, and horizontal displacement corresponds to physical distance normal to the InP/AlGaAsSb interface 230. The electronic bandgap, or the difference between the conduction band energy and the valence band energy, is roughly 1.345 eV in the InP, and about 0.91 eV in the AlGaAsSb alloy. Both these bandgaps are larger than the intended photon energy, which at 1.55 micron wavelength is about 0.82 eV. As a result, laser photons are not lost in exciting valence electrons up to their corresponding conduction band.

However, what has not been appreciated heretofore is that it is possible for a spatially indirect electronic excitation to be caused by a 0.82 eV photon. Such an event is shown as transition 200 in FIG. 2. Here an electron is excited from an occupied initial state 201 in the valence band in the AlGaAsSb alloy into an empty final state 202 in the conduction band of the InP material. Transition 200 requires a minimum photon energy of about 0.60 eV in this material system. As a result, spatially indirect electronic excitations can result in significant absorption of the desired 1.55 $\mu$m (0.82 eV) photons, and hence can degrade or preclude 1.55 $\mu$m VCSEL operation.

The influence of spatially indirect photon-assisted electronic transitions is not limited to the InP/AlGaAsSb material system. Any material system in which the difference in energy between the valence band of one material and the conduction band of an adjoining material is less than the photon energies of interest to the intended function of the device allows such transitions, and hence will exhibit optical absorption of the device photons.

There is a need in the art for a VCSEL structure which can be grown monolithically, comprising distributed Bragg reflectors having suitable reflectivity and electrical and thermal transport properties, in which spatially indirect electronic transitions are inhibited. Other uses of such low-absorption distributed Bragg reflectors will be clear to one skilled in the art.

SUMMARY OF THE INVENTION

A distributed Bragg reflector exhibiting high reflectivity and low absorption for photons of a predetermined energy E and a predetermined propagation axis has been developed. Such a distributed Bragg reflector comprises a stacked plurality of repeat units, where each repeat unit comprises a high-index layer, a first interlayer, a low-index layer, and a second interlayer. The presence of the first and second interlayers substantially prevents optical absorption from spatially indirect photon-assisted electronic transitions.

DETAILED DESCRIPTION

Figure 1:
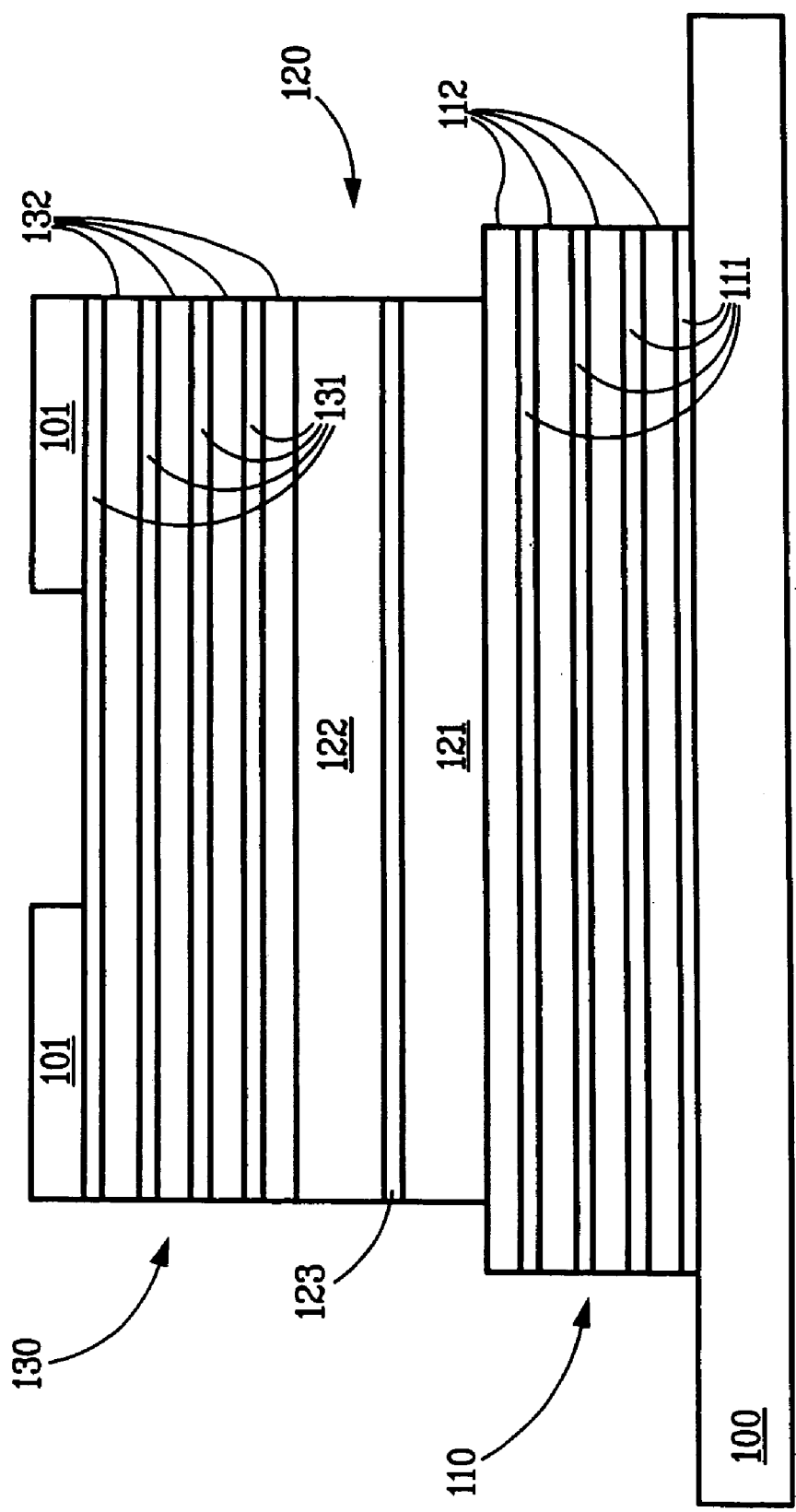
FIG. 1 shows a schematic cross-sectional view of a vertical cavity surface emitting laser, or VCSEL.
Figure 2:
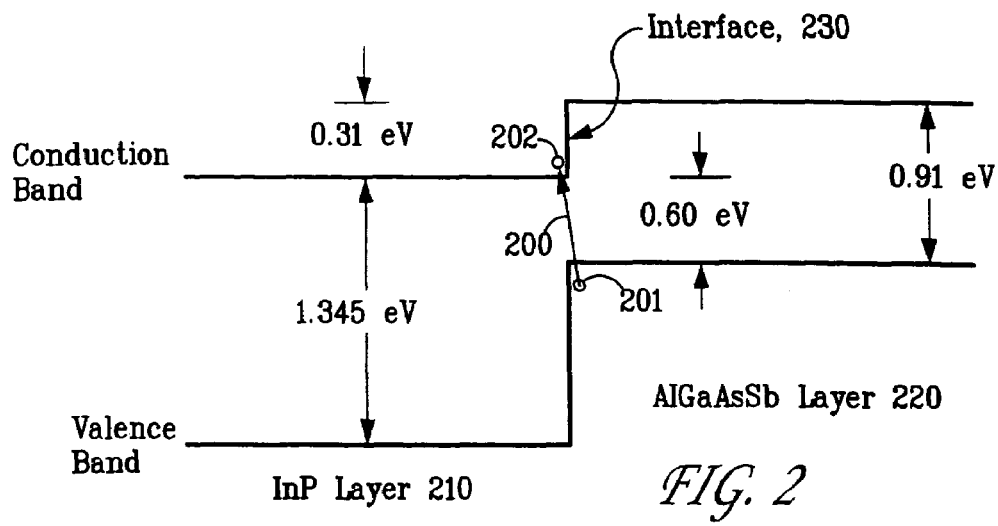
FIG. 2 shows the electronic bandstructure of an abrupt InP/AlGaAsSb heterojunction, with a spatially indirect electronic transition indicated.

FIG. 2 shows the electronic bandstructure of a distributed Bragg reflector (DBR) which is subject to absorption from spatially indirect electronic transitions (e.g., transition 200) between the layers making up the DBR.

The strength of a spatially indirect electronic transition depends, among other things, on the spatial overlap of the initial and final electronic states. In typical optical materials, the probability density of the electronic states falls off exponentially from a center (often with an orientation dependence as well). The characteristic length for this exponential decay is typically less than about two nanometers. As a result, the probability of exciting a spatially indirect electronic transition can be greatly reduced according to the present invention by separating the layers of the DBR across which spatially indirect transitions are energetically favorable by inserting an appropriate interlayer between the layers making up the DBR. Such an interlayer according to the present invention can comprise a binary, ternary or quaternary III-V or II-VI compound semiconductor material having energy band characteristics as delineated hereinafter. This interlayer increases the spatial separation between the initial and final electronic states, and the increase in spatial separation results in a decrease in the spatial overlap of the initial and final electronic states which depends approximately exponentially on the thickness of the interlayer.

Figure 3:
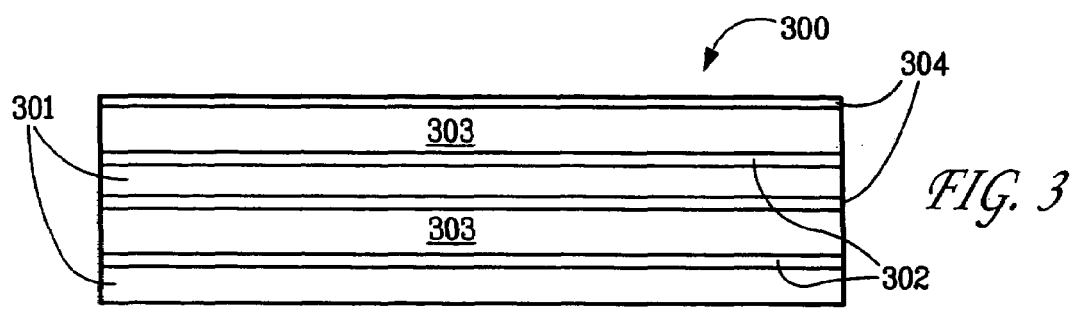
FIG. 3 shows a schematic cross-sectional view of a distributed Bragg reflector according to the instant invention.

A distributed Bragg reflector incorporating an interlayer between each set of high-index and low-index layers according to the present invention is shown schematically and not to scale in FIG. 3. In this example the distributed Bragg reflector (DBR) 300 designed for a predetermined photon energy E comprises a stack comprising two repeat units, where each repeat unit consists essentially of four layers: a first interlayer 304 atop a low-index layer 303 atop a second interlayer 302 atop a high-index layer 301. Most practical DBRs will comprise from about 6 to 40 or 50 repeat units depending upon the required reflectivity. The example shown here is simplified for clarity of illustration. In other embodiments of the present invention, the order of the low-index layers 303 and the high-index layers 301 can be reversed. Also, in many cases, the first and second interlayers will comprise essentially the same material, although this is not necessary to their function. In a typical application (e.g. for a vertical-cavity surface-emitting laser), the optical thickness of each repeat unit is nominally one-half wavelength of photons having the predetermined energy E.

Figure 4:
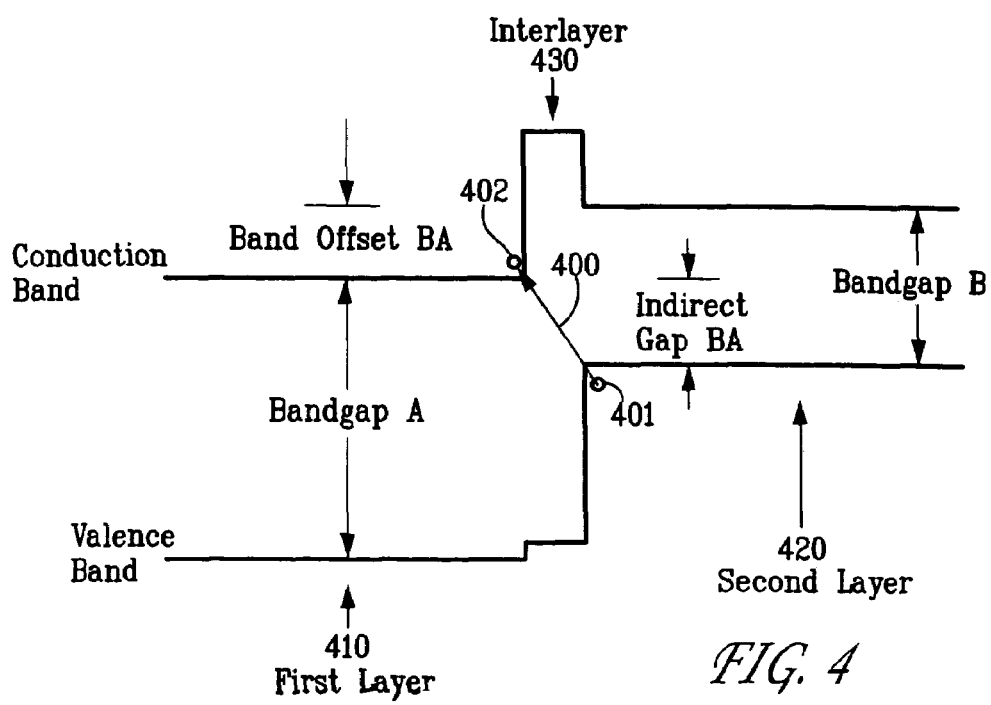
FIG. 4 shows an electronic bandstructure typical of a distributed Bragg reflector according to the instant invention.

The effect of inserting such interlayers of the present invention is shown in FIG. 4. This shows the electronic bandstructure in a portion of a distributed Bragg reflector designed for a predetermined photon energy E. Here, a first layer 410 and an adjacent second layer 420 are separated by interlayer 430. Another interlayer 430 (not shown) can be provided between the second layer 420 and an additional first layer 410 when the arrangement of FIG. 4 is repeated multiple times to build up the structure of the distributed Bragg reflector. The material of first layer 410 is characterized by a conduction band energy $E_c^1$ and a valence band energy $E_v^1$, and an electronic bandgap $E_b^1$ equal to $E_c^1 - E_v^1$ (denoted as Bandgap A in FIG. 4). The material of first layer 410 is chosen so that the electronic bandgap $E_b^1$ is greater than the predetermined photon energy E, so that first layer 410 is substantially transparent to photons with energy E. The first layer 410 can comprise, for example, a low-index material such as InP with a bandgap energy $E_b^1$ equal to 1.345 eV.

Similarly, the material of second layer 420 is characterized by a conduction band energy $E_c^2$ and a valence band energy $E_v^2$, and an electronic bandgap $E_b^2$ equal to $E_c^2 - E_v^2$ (denoted as Bandgap B in FIG. 4). The material of second layer 420 is chosen so that the electronic bandgap $E_b^2$ is greater than the predetermined photon energy E, so that second layer 420 is substantially transparent to photons with energy E. The second layer 420 can comprise, for example, a high-index material such as AlGaAsSb with a semiconductor alloy composition near $Al_{0.1}Ga_{0.9}As_{0.52}Sb_{0.48}$ for lattice-matching to the InP first layer 410. The $Al_{0.1}Ga_{0.9}As_{0.52}Sb_{0.48}$ high-index material has a bandgap energy $E_b^2$ equal to 0.91 eV.

As shown, the primary effect of introducing interlayer 430 is to increase the spatial separation of initial state 401 and final state 402 by the thickness of the interlayer 430. This exponentially reduces the probability of the transition, so that introduction of an interlayer with thickness far smaller than the nominal quarter-wavelength layers used in a distributed Bragg reflector can substantially eliminate optical absorption from such spatially indirect electronic transitions.

The material of interlayer 430 must obey a number of conditions to avoid introduction of substantial new sources of absorption of photons of the predetermined energy. The material of interlayer 430 is characterized by a conduction band energy $E_c^{IL}$, a valence band energy $E_v^{IL}$, and an electronic bandgap $E_b^{IL}$ equal to $E_c^{IL}-E_v^{IL}$. The electronic bandgap $E_b^{IL}$ is chosen to be greater than the predetermined photon energy E, to avoid photon absorption by spatially direct photon-assisted electronic transitions between interlayer states.

In addition, spatially indirect photon-assisted electronic transitions between electronic states in the interlayer and electronic states in the surrounding material should be avoided. To accomplish this, the following four quantities should all be greater than the predetermined photon energy E: $E_c^1-E_v^{IL}$; $E_c^{IL}-E_v^1$; $E_c^2-E_v^{IL}$; $E_c^{IL}-E_v^2$.

The interlayer 430 can comprise, for example, AlAsSb or AlGaAsSb when the first layer 410 comprises InP and the second layer 420 comprises AlGaAsSb, with a semiconductor alloy composition of the AlAsSb or AlGaAsSb selected to satisfy the above criteria. In the case of an AlAsSb interlayer 430, the AlAsSb can comprise the semiconductor alloy composition $AlAs_{0.56}Sb_{0.44}$ which is substantially lattice-matched to InP (e.g. to the InP first layers 410 and also to an InP substrate whereon the distributed Bragg reflector can be epitaxially grown by molecular beam epitaxy). In the case of an AlGaAsSb interlayer 430, the amount of aluminum, Al, in the semiconductor alloy can be increased relative to that in the AlGaAsSb second layer 420 in order to satisfy the above criteria for each interlayer 430 and, in particular, to provide $E_c^1-E_v^{IL}>E$. As an example, when the AlGaAsSb second layer 420 comprises $Al_{0.1}Ga_{0.9}As_{0.52}Sb_{0.48}$ which is substantially lattice-matched to InP, the AlGaAsSb interlayer 430 can comprise the semiconductor alloy $Al_xGa_{1-x}As_{1-y}Sb_y$ with $0.89<x<1.0$ and with $0.44<y<0.445$, and with the exact value of y in this range generally being selected to provide a substantial lattice-matching to InP. It should be noted that although the examples of the interlayer 430 provided herein are substantially lattice-matched to InP, this is not always necessary due to the small thickness ($\geq 10$ nm) of the interlayers 430. In other embodiments of the present invention, the interlayers 430 can be strained.

A new class of distributed Bragg reflectors comprising interlayers has been invented. The distributed Bragg reflectors can be doped for electrical conductivity during epitaxial growth (e.g. to form a VCSEL). The specific implementations discussed above are not intended to limit the scope of the present invention—that scope is intended to be set by the claims interpreted in view of the specification.

What is claimed is:

1. A distributed Bragg reflector exhibiting high reflectivity for photons of a predetermined energy E and a predetermined propagation axis, said reflector comprising a stacked plurality of repeat units, each repeat unit comprising a high-index layer, a first interlayer atop said high-index layer, a low-index layer atop said first interlayer, and a second interlayer atop said low-index layer, wherein:

a) said high-index layer is composed essentially of a first material which is characterized by a first index of refraction, a first conduction band energy $E_c^1$, a first valence band energy $E_v^1$ and a first electronic bandgap $E_b^1$, said first electronic bandgap $E_b^1$ being greater than the predetermined energy E;

b) said low-index layer is composed essentially of a second material which is characterized by a second index of refraction which is smaller than said first index of refraction, a second conduction band energy $E_c^2$, a second valence band energy $E_v^2$ and a second electronic bandgap $E_b^2$, said second electronic bandgap $E_b^2$ being greater than the predetermined energy E;

c) said first interlayer has a thickness along said predetermined propagation axis not greater than about 10 nanometers, and is composed essentially of a first interlayer material which is characterized by a first interlayer conduction band energy $E_c^{IL1}$ and a first interlayer valence band energy $E_v^{IL1}$, the energies $E_c^{IL1}-E_v^{IL1}$; $E_c^{IL1}-E_v^1$; $E_c^1-E_v^{IL1}$; $E_c^{IL1}-E_v^2$; $E_c^2-E_v^{IL1}$ all being greater than said predetermined energy E;

d) said second interlayer has a thickness along said predetermined propagation axis not greater than about 10 nanometers, and is composed essentially of a second interlayer material which is characterized by a second interlayer conduction band energy $E_c^{IL2}$ and a second interlayer valence band energy $E_v^{IL2}$, the energies $E_c^{IL2}-E_v^{IL2}$; $E_c^{IL2}-E_v^1$; $E_c^1-E_v^{IL2}$; $E_c^{IL1}-E_v^2$; $E_c^2-E_v^{IL1}$ all being greater than said predetermined energy E;

and further wherein the combined optical thickness along said propagation axis of each repeat unit is nominally equal to one-half of the wavelength of said photons of a predetermined energy.

2. The distributed Bragg reflector of claim 1, wherein the first interlayer material and the second interlayer material are substantially identical.

3. The distributed Bragg reflector of claim 1 wherein the high-index layer consists essentially of aluminum gallium arsenide antimonide (AlGaAsSb), the low-index layer consists essentially of indium phosphide (InP), and the first and second interlayers consist essentially of aluminum arsenide antimonide (AlAsSb).

4. The distributed Bragg reflector of claim 3 wherein the AlGaAsSb consists essentially of $Al_{0.1}Ga_{0.9}As_{0.52}Sb_{0.48}$.

5. The distributed Bragg reflector of claim 3 wherein a semiconductor alloy composition of the AlAsSb in the first and second interlayers is substantially identical.

6. The distributed Bragg reflector of claim 5 wherein the AlAsSb in the first and second interlayers consists essentially of $AlAs_{0.56}Sb_{0.44}$.

7. The distributed Bragg reflector of claim 1 wherein the high-index layer consists essentially of aluminum gallium arsenide antimonide (AlGaAsSb), the low-index layer consists essentially of indium phosphide (InP), and the first and second interlayers each consist essentially of aluminum gallium arsenide antimonide (AlGaAsSb), with an aluminum content in the first and second interlayers being higher than the aluminum content of the AlGaAsSb low-index layer.

8. The distributed Bragg reflector of claim 7 wherein the high-index layer consists essentially of $Al_{0.1}Ga_{0.9}As_{0.52}Sb_{0.48}$.

9. The distributed Bragg reflector of claim 7 wherein a semiconductor alloy composition of the AlGaAsSb in the first and second interlayers is substantially identical.

10. The distributed Bragg reflector of claim 7 wherein the AlGaAsSb in the first and second interlayers consists essentially of $Al_xGa_{1-x}As_{1-y}Sb_y$ with $0.89<x<1.0$ and with $0.44<y<0.445$.

11. The distributed Bragg reflector of claim 1 wherein the plurality of repeat units comprises at least six repeat units and less than or equal to fifty repeat units.

12. A distributed Bragg reflector for use at a wavelength near 1.55 μm, comprising a stacked plurality of repeat units with each repeat unit having an optical thickness substantially equal to one-half of the wavelength near 1.55 µm, and with each repeat unit comprising a high-index layer consisting essentially of aluminum gallium arsenide antimonide (AlGaAsSb); a first interlayer adjacent the high-index layer; a low-index layer consisting essentially of indium phosphide (InP) adjacent the first interlayer; and a second interlayer adjacent the low-index layer, and with the first and second interlayers each having an energy bandgap greater than 0.82 eV and each acting to substantially prevent optical absorption in the distributed Bragg reflector from spatially indirect photon-assisted transitions between the high-index and low-index layers therein.

13. The distributed Bragg reflector of claim 12 wherein the first and second interlayers each have a layer thickness of less than or equal to 10 nanometers.

14. The distributed Bragg reflector of claim 12 wherein the first and second interlayers each consist essentially of AlAsSb.

15. The distributed Bragg reflector of claim 14 wherein a semiconductor alloy composition of the AlAsSb in the first and second interlayers is substantially identical.

16. The distributed Bragg reflector of claim 15 wherein the semiconductor alloy composition of the AlAsSb in the first and second interlayers is $AlAs_{0.56}Sb_{0.44}$.

17. The distributed Bragg reflector of claim 12 wherein the first and second interlayers each consist essentially of AlGaAsSb with an aluminum composition higher than the aluminum composition of each AlGaAsSb high-index layer.

18. The distributed Bragg reflector of claim 17 wherein a semiconductor alloy composition of the AlGaAsSb in the first and second interlayers is substantially identical.

19. The distributed Bragg reflector of claim 18 wherein the semiconductor alloy composition of the AlGaAsSb in the first and second interlayers is $Al_xGa_{1-x}As_{1-y}Sb_y$ with $0.89<x<1.0$ and with $0.44<y<0.445$.

20. The distributed Bragg reflector of claim 12 wherein the plurality of repeat units comprises at least six repeat units and less than or equal to fifty repeat units.

21. A distributed Bragg reflector for use at a wavelength near 1.55 µm comprising a plurality of alternating high-index and low-index layers, with the high-index layers comprising $Al_{0.1}Ga_{0.9}As_{0.52}Sb_{0.48}$ and with the low-index layers comprising indium phosphide (InP); and an interlayer comprising $AlAs_{0.56}Sb_{0.44}$ or $Al_xGa_{1-x}As_{1-y}Sb_y$ with $0.89<x<1.0$ and with $0.44<y<0.445$ located between each adjacent pair of the high-index and low-index layers.

22. The distributed Bragg reflector of claim 21 wherein the interlayer has a layer thickness of less than or equal to 10 nanometers.

23. The distributed Bragg reflector of claim 21 wherein a repeat unit comprising a pair of the high-index and low-index layers and a pair of adjacent interlayers has an optical thickness substantially equal to one-half of the wavelength near 1.55 µm.

* * * * *